United States Patent
Ryckaert et al.

(10) Patent No.: US 10,242,907 B2
(45) Date of Patent: Mar. 26, 2019

(54) METHOD FOR INTERRUPTING A LINE IN AN INTERCONNECT

(71) Applicant: IMEC VZW, Leuven (BE)

(72) Inventors: Julien Ryckaert, Schaerbeek (BE); Juergen Boemmels, Heverlee (BE); Christopher Wilson, Tervuren (BE)

(73) Assignee: IMEC vzw, Leuven (BE)

( * ) Notice: Subject to any disclaimer, the term of this patent is extended or adjusted under 35 U.S.C. 154(b) by 73 days.

(21) Appl. No.: 15/615,299

(22) Filed: Jun. 6, 2017

(65) Prior Publication Data

US 2017/0352587 A1    Dec. 7, 2017

(30) Foreign Application Priority Data

Jun. 7, 2016   (EP) .................................... 16173359

(51) Int. Cl.
| | | |
|---|---|---|
| *H01L 21/4763* | (2006.01) | |
| *H01L 21/768* | (2006.01) | |
| *H01L 21/033* | (2006.01) | |
| *H01L 21/311* | (2006.01) | |
| *H01L 23/528* | (2006.01) | |

(52) U.S. Cl.
CPC .... *H01L 21/76816* (2013.01); *H01L 21/0332* (2013.01); *H01L 21/0337* (2013.01); *H01L 21/31116* (2013.01); *H01L 21/31122* (2013.01); *H01L 21/31144* (2013.01); *H01L 23/528* (2013.01)

(58) Field of Classification Search
CPC ............. H01L 21/0332; H01L 21/0337; H01L 21/31116; H01L 21/31122; H01L 21/31144; H01L 21/76816; H01L 23/528

USPC .................................. 438/585, 618; 257/329
See application file for complete search history.

(56) References Cited

U.S. PATENT DOCUMENTS

| | | | | |
|---|---|---|---|---|
| 2009/0294842 | A1* | 12/2009 | Juengling | ........... H01L 21/3081 257/329 |
| 2012/0045901 | A1 | 2/2012 | Kim et al. | |
| 2012/0058640 | A1 | 3/2012 | Kim et al. | |
| 2012/0104485 | A1* | 5/2012 | Yang | ..................... H01L 21/764 257/324 |
| 2012/0289019 | A1 | 11/2012 | Im et al. | |

(Continued)

OTHER PUBLICATIONS

Extended European Search Report dated Oct. 31, 2016 in EP Application No. 16173359.7.

*Primary Examiner* — Brook Kebede
(74) *Attorney, Agent, or Firm* — Knobbe Martens Olson & Bear LLP

(57) ABSTRACT

A method for forming a pattern for an integrated circuit is disclosed. In one aspect, the method includes (a) providing a hardmask layer; (b) overlaying the hard mask layer with a set of parallel material lines delimiting gaps therebetween; and (c) providing a spacer layer following the shape of the material layer. The method further includes (d) removing a top portion of the spacer layer, thereby forming spacer lines alternatively separated by material lines and by gaps; and (e) providing a blocking element in a portion of a gap. The method also includes (f) etching selectively the hard mask layer by using the material layer, the spacer lines and the blocking element as a mask, thereby providing a first set of parallel trenches in the hardmask layer, wherein a trench has a blocked portion; and (g) selectively removing the blocking element.

10 Claims, 16 Drawing Sheets

(56) References Cited

U.S. PATENT DOCUMENTS

| | | |
|---|---|---|
| 2014/0083972 A1 | 3/2014 | Oyama et al. |
| 2014/0166964 A1* | 6/2014 | Lee .................. H01L 45/06 257/4 |
| 2014/0199843 A1 | 7/2014 | Tsujita et al. |
| 2015/0131382 A1 | 5/2015 | Himeno |
| 2016/0293419 A1* | 10/2016 | Nam .................. H01L 23/528 |

* cited by examiner

METHOD FOR INTERRUPTING A LINE IN AN INTERCONNECT

CROSS-REFERENCE TO RELATED APPLICATIONS

This application claims foreign priority to European Patent Application EP16173359.7, filed Jun. 7, 2016, the contents of which are incorporated by reference herein in its entirety.

BACKGROUND

Technological Field

The present disclosure relates to the field of interconnect formation during semiconductor manufacturing and in particular to the interruption of trenches used to form interconnect lines.

Description of the Related Technology

For the manufacturing of integrated circuits, conductive lines of well-defined dimension and position must be formed on or in a semiconductor substrate. For this purpose, trenches can be formed on the semiconductor substrate that will later be filled with a conductive material in a so-called damascene process. The formation of these trenches operates by a combination of photolithographic and etching steps. Typically, a pattern of photoresist lines is formed that will, in subsequent steps, be transferred to a hard mask, thereby forming a patterned hard mask defining a set of trenches. The target set of metal lines can then for instance be formed in an inter-layer dielectric layer. In such a case, the patterned hard mask is used to form a plurality of trenches in the inter-layer dielectric layer. The obtained trenches can then be filled with a conductive material. As the dimensions and the density of the lines become smaller and smaller, good control of the lines dimensions and positions becomes increasingly difficult.

In advanced Back End Of Line (BEOL) interconnect formation for 14 nm semiconductor technology and beyond, a common approach for the formation of conductive lines of defined length and position is to form a set of parallel lines (also called a grating), then to interrupt these lines. This is usually done by blocking a gap (6) with blocking elements before it is transferred as a trench into the hard mask. The grating is usually done with self-aligned double patterning (SADP) or self-aligned quadruple patterning (SAQP) technology. The issue with this scheme is that the edge placement accuracy of the blocking elements needs to be precise enough not to cause shorts on the line that was meant to be cut or not to cut an adjacent line. This is depicted in FIG. 24 where a set of five parallel gaps (6) is depicted and where blocks (7b) are interrupting these gaps. The circle points to the edge of a block (7b) interrupting a gap (6), this edge being at a safe distance from a neighboring gap.

The window for edge placement accuracy is usually defined by the space between the gaps (6). In advanced interconnect the tendency is to widen the Cu lines hence giving less process windows for cut placement.

The present disclosure provides a method relaxing the precision required for block placement.

SUMMARY OF CERTAIN INVENTIVE ASPECTS

It is an object of the present disclosure to provide good methods for forming trenches having a blocked portion.

It is an advantage of embodiments of the present disclosure that trenches can be blocked and therefore conductive lines can be interrupted, in semiconductor interconnect schemes, with reduced chance of cutting the neighboring lines.

It is an advantage of embodiments of the present disclosure that trenches can be blocked by using blocking elements extending farther than the middle of the space separating two trenches. The blocking elements of one trench may even overlap partially with the two neighboring trenches, without leading to these trenches being blocked or even partially blocked. Compared to the situation of the prior art depicted in FIG. 24, this is a drastic relaxation in the maximal dimensions of the blocking elements, often by a factor two or three.

It is another advantage of embodiments of the present disclosure that the etching selectivity required is relaxed due to the protecting effect of the longer blocking elements.

The above objective is accomplished by a method and device according to the present disclosure.

In a first aspect, the present disclosure relates to a method for forming a pattern for an integrated circuit, including the steps of:
  a. providing a hardmask layer (3),
  b. overlaying the hard mask layer (3) with a material layer (4) having a shape including a set of parallel material lines (4l) delimiting gaps (6) therebetween, the gaps (6) forming a first set of gaps (6),
  c. providing a spacer layer (5) following the shape of the material layer (4), the spacer layer (5) thereby covering the top of the material lines (4l),
  d. removing a top portion (5t) of the spacer layer (5) in such a way as to expose a top surface (4t) of the material lines (4l), thereby forming spacer lines (5l) alternatively separated by material lines (4l) and by gaps (6) of the first set,
  e. providing a blocking element (7b) in a portion of a gap (6) of the first set present between two spacer lines (5l) and between two material lines (4l),
  f. etching selectively the hard mask layer (3) by using the material layer (4), the spacer lines (5l) and the blocking element (7b) as a mask, thereby providing a first set of parallel trenches (8) in the hardmask layer (3), wherein a trench (8a) has a blocked portion (3b), and
  g. selectively removing the blocking element (7b).

In a second aspect, the present disclosure relates to an intermediate structure in the fabrication of an integrated circuit, the structure including a hardmask layer (3), a set of n parallel material lines (4l), a set of 2n spacer lines (5l) separated alternatively by material lines (4l) and by gaps (6), and a blocking element (7b) in a portion of a gap (6) present between two spacer lines (5l).

Particular and preferred aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

Figure 1:
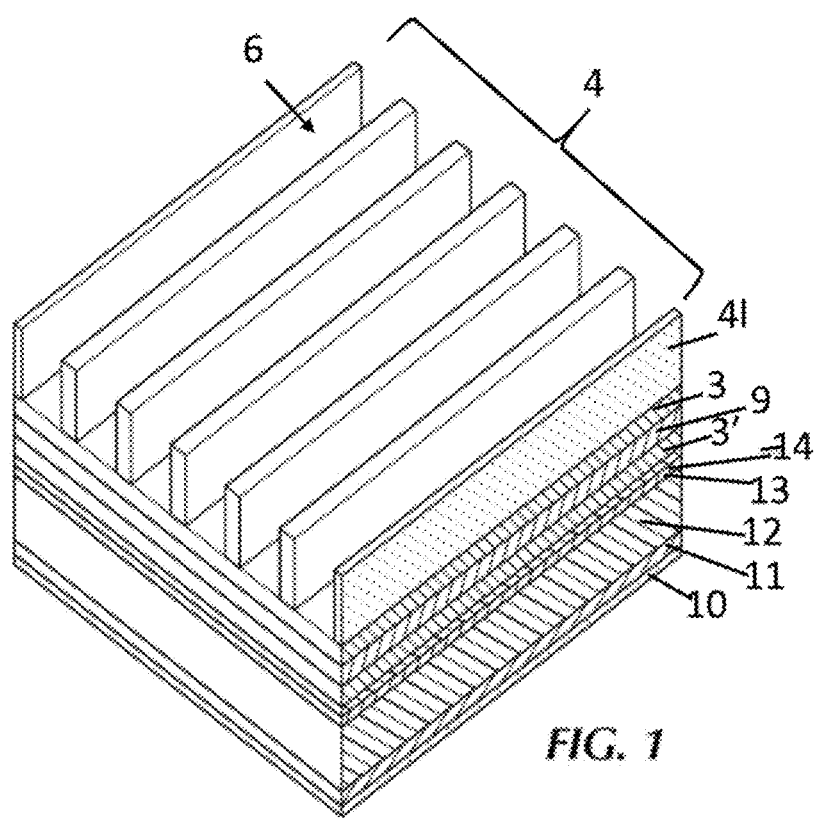
FIGS. 1 to 10 and 12 to 23 are perspective views of structures resulting from steps of a method according to an embodiment of the present disclosure.

In the different figures, the same reference signs refer to the same or analogous elements.

DETAILED DESCRIPTION OF CERTAIN ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn to scale for illustrative purposes. The dimensions and the relative dimensions do not correspond to actual reductions to practice of the illustrative embodiments.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Similarly, it is to be noticed that the term "coupled," also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed embodiment requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

As used herein, when a first material is said to be etched selectively with respect to a second material, this means that the first material is etched faster than the second material. For instance, the etching process could etch the first material at least twice as fast or at least five times faster than the second material. In some preferred embodiments, the second material may be not etched or substantially not etched by the etching process.

The disclosure will now be described by a detailed description of several embodiments. It is clear that other embodiments of the disclosure can be configured according to the knowledge of persons skilled in the art without departing from the technical teaching of the disclosure.

In a first aspect, the present disclosure relates to a method for forming a pattern for an integrated circuit. The core of an embodiment of the method is summarized in steps a to g of the flowchart of FIG. 26.

Figure 22:
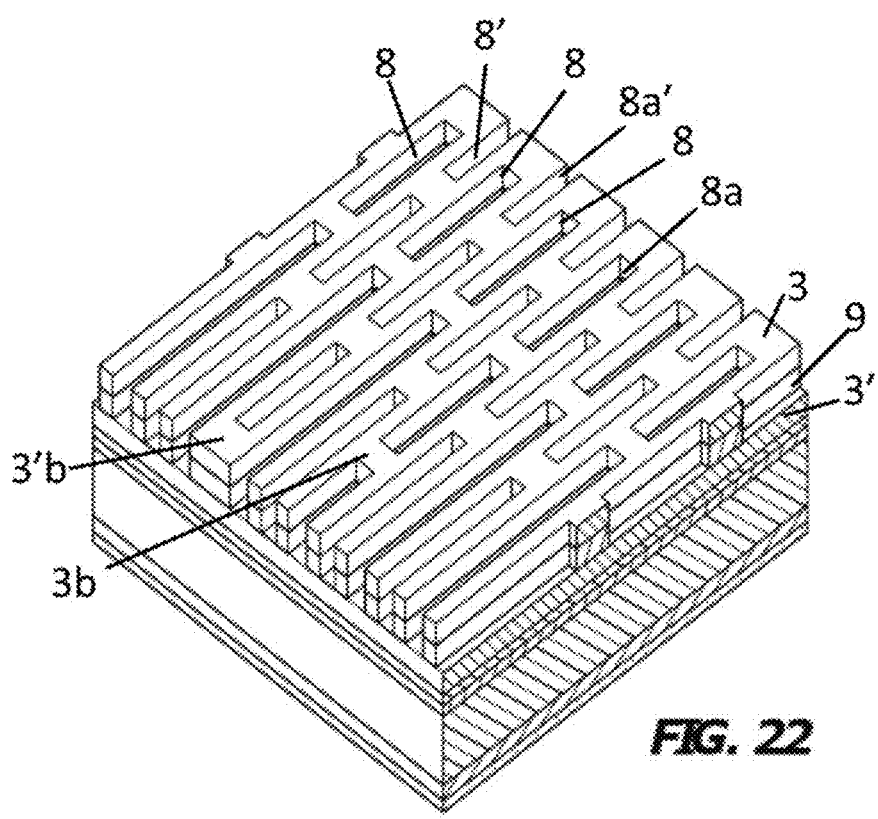
Figure 23:
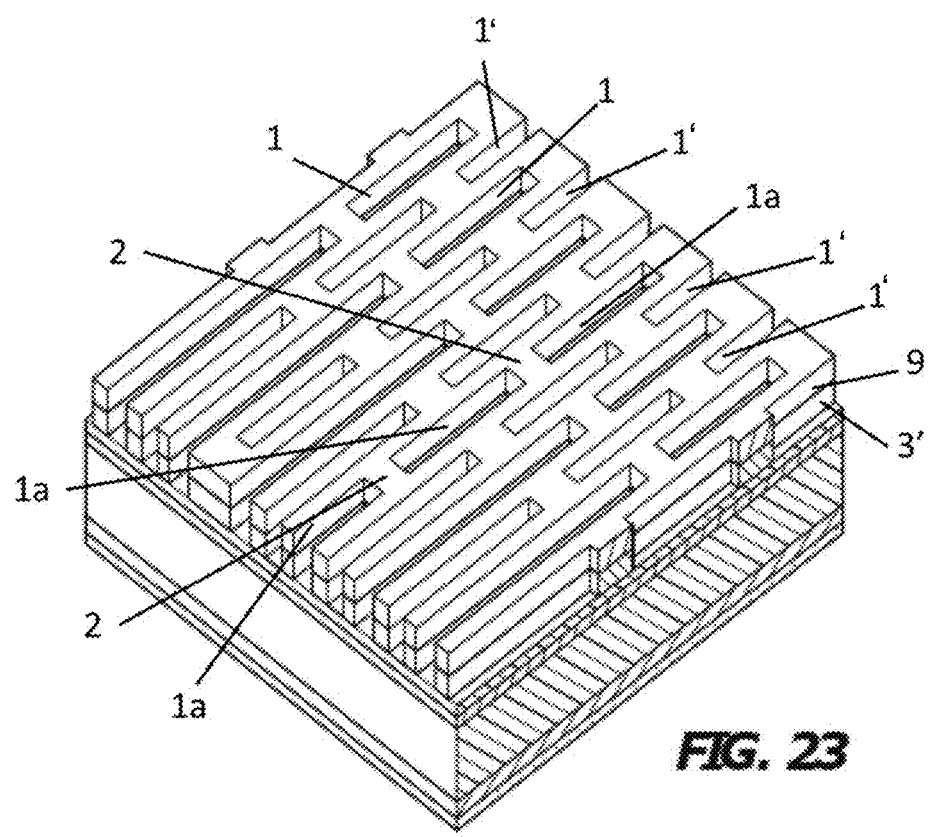

In embodiments, the pattern may be a set of trenches (8, 8', 1, 1') formed in a hardmask (3) (see FIGS. 11 and 22) or in a target substrate (9) (see FIG. 23). At least one of these trenches is interrupted by a blocking hard mask element (3b) (when the trenches (8, 8') are formed in a hardmask (3)) or by a blocking target element (2) (when the trenches (1, 1') are formed in a target substrate (9)).

In other embodiments, the pattern may be a set of conductive lines obtained by filling with a conductive material the sets of trenches (1, 1') formed in the target substrate (9).

We are now referring to FIG. 1.

The method of the present disclosure includes a step a of providing a hardmask layer (3).

Figure 8:
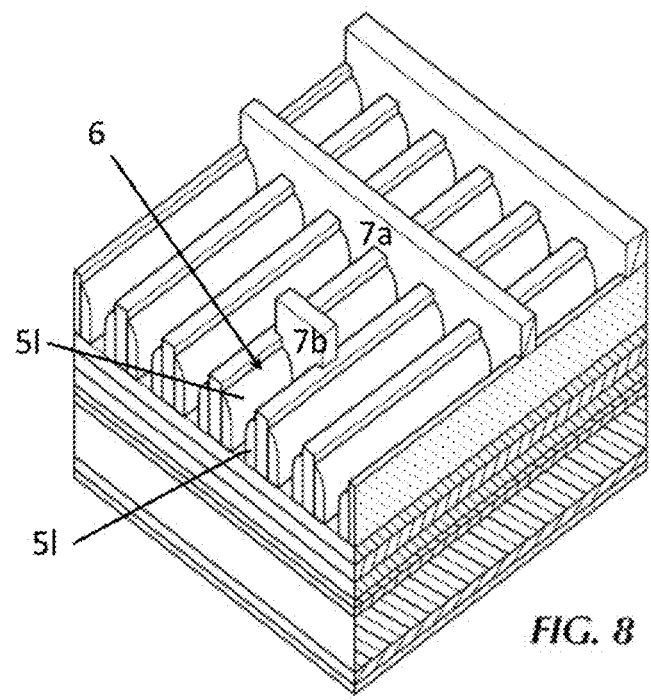

The hardmask layer (3) is in a material that can be etched selectively with respect of the material layer (4), the spacer lines (5l) and the blocking element (7b) (see FIG. 8). Therefore the material of the hardmask layer (3) is different from the materials used for the material layer (4), the spacer lines (5l) and the blocking element (7b). An example of suitable material for the hardmask layer (3) is TiN. If the material of the hardmask layer (3) is TiN, a suitable material for the material layer (4) may be amorphous silicon and is preferably strained amorphous silicon, a suitable material for the spacer lines (5l) may be silicon nitride or silicon oxide, and a suitable material for the blocking element (7b) may be a spin-on carbon material. Suitable plasmas for etching TiN selectively with respect to amorphous silicon, silicon nitride or oxide and spin-on carbon are well-known to the person skilled in the art and are typically Cl-based plasmas.

In embodiments, the hardmask layer (3) may be above a target substrate (9). For instance, it may be on a target substrate (9).

In embodiments where the hardmask layer (3) is above a target substrate (9), the hardmask layer (3) is made of a material such that the target substrate (9) can be etched selectively with respect to the hardmask layer (3). If the hardmask layer is made of TiN, the target substrate (9) may be made of, for instance, silicon oxide. Suitable plasmas for etching silicon oxide selectively with respect to TiN are well-known to the person skilled in the art and are typically F-based plasmas.

FIG. 1 shows a non-limitative example of a multilayer structure including a silicon wafer (10), an etch stop layer (11) overlaying the silicon wafer (10), an ultra-low-k layer (12) overlaying the silicon wafer (10), an interface layer (13) overlaying the ultra-low-k layer (12), a silicon oxide cap layer (14) overlaying the interface layer (13), a secondary hardmask (3') overlaying the silicon oxide cap layer (14), the target substrate (9) overlaying the secondary hardmask (3'), and the hardmask layer (3) overlaying the target substrate (9).

The thickness of the ultra low-k layer (12) may for instance be between 40 and 90 nm. For instance it can be 65 nm thick.

The thickness of the interface layer (13) may for instance be between 5 and 20 nm. For instance, it can be 10 nm thick.

The thickness of the silicon oxide cap layer (14) may for instance be between 5 and 20 nm. For instance, it can be 10 nm thick.

The secondary hardmask (3') may be as described for the hardmask layer (3) in any embodiment of the disclosure.

The multilayer structure of FIG. 1 can be formed by sequentially depositing on the silicon wafer (10) the etch stop layer (11), the ultra-low-k layer (12), the interface layer (13), the oxide cap layer (14), the secondary hardmask (3'), the target substrate (9) and the hardmask layer (3).

Following step a, the first aspect of the present disclosure includes a step b of overlaying a material layer (4) on the hard mask layer (3), the material layer (4) having a shape including a set of parallel material lines (4l) delimiting gaps (6) therebetween, the gaps (6) forming a first set of gaps (6). The end result of that step in an embodiment of the present disclosure can be seen in FIG. 1. The pitch of the parallel material lines (4l) is preferably from 10 to 80 nm. The width of the parallel material lines (4l) is preferably from 2.5 to 20 nm. The width of the parallel material lines (4l) is typically one fourth of the pitch between two parallel material lines (4l). The height of the parallel material lines (4l) and therefore the thickness of the material layer (4) is preferably from 15 to 100 nm and can for instance be 50 nm.

In embodiments, step b may include the following sub-steps (not depicted in FIG. 1):

Sub-step b1 of overlaying a (non-patterned) material layer (4) on the hard mask layer (3). A suitable material for the material layer (4) is for instance amorphous silicon and is preferably strained amorphous silicon.

Sub-step b2, performed after sub-step b1, of overlaying a silicon oxycarbide (SiOC) layer (not depicted in FIG. 1) on the material layer (4), Sub-step b3, performed after sub-step b2, of overlaying the SiOC layer with a set of parallel resist lines. Parallel resist lines may for instance be provided by coating a resist layer on the SiOC layer, exposing the resist layer through a first mask suitable for forming the parallel resist lines, developing the resist layer in order to remove the unexposed parts of the resist layer, thereby forming the parallel resist lines.

Sub-step b4, performed after sub-step b3, of selectively etching the SiOC layer through the set of parallel resist lines, thereby forming a set of parallel SiOC lines. Suitable plasmas for etching SiOC selectively are well-known to the person skilled in the art and are typically oxygen or forming gas based plasmas.

Sub-step b5, performed after sub-step b4, of selectively etching the material layer (4) through the set of SiOC lines, thereby forming a set of material lines (4l). Suitable plasmas for etching amorphous silicon selectively with respect to SiOC are well-known to the person skilled in the art and are typically Br-based plasmas.

An optional sub-step b6, performed after sub-step b5, of trimming the set of material lines (4). This trimming may for instance be performed by using an anisotropic plasma etching step.

A sub-step b7, performed after sub-step b5, and after sub-step b6 if present, of removing the SiOC lines. This removal can for instance be a wet removal. The end-result of sub-step b7 is the material layer (4) overlaying the hard mask layer (3), the material layer (4) having a shape including a set of parallel material lines (4*l*) delimiting gaps (6) therebetween, the gaps (6) forming a first set of gaps (6).

Figure 2:
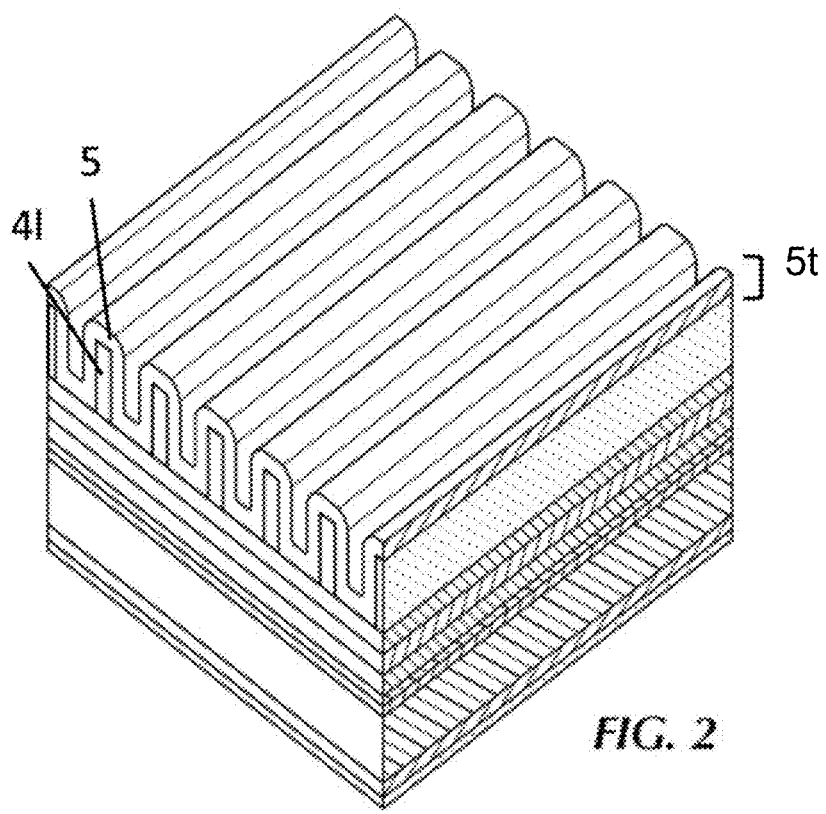

Following step b, the first aspect of the present disclosure includes a step c of providing a spacer layer (5) following the shape of the material layer (4), the spacer layer (5) thereby covering the top of the material lines (4*l*). This is depicted for an embodiment in FIG. 2.

In embodiments, the spacer layer (5) may be a silicon nitride or silicon oxide layer. The spacer layer (5) follows (i.e. espouses) the shape of the material layer (4), i.e. it at least covers the top and the sidewalls of the material lines (4*l*) and it typically also covers the bottom of the gaps (6) of the first set. The spacer layer (5) reduces the volume of the gaps (6) but does not entirely fill the gaps (6) of the first set.

Figure 3:
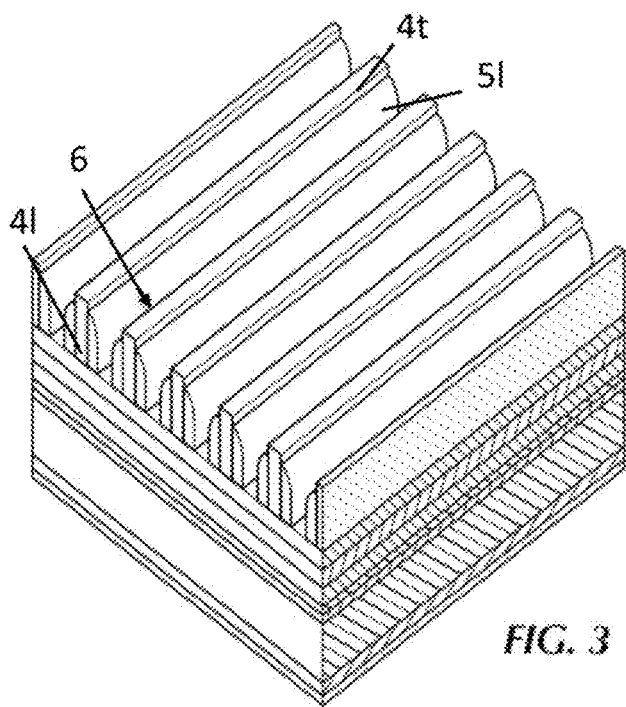

Following step c, the first aspect of the present disclosure includes a step d of removing a top portion (5*t*) of the spacer layer (5) in such a way as to expose a top surface (4*t*) of the material lines (4*l*), thereby forming spacer lines (5*l*) alternatively separated by material lines (4*l*) and by gaps (6) of the first set. This is depicted in an embodiment in FIG. 3. In embodiments, removing a top portion (5*t*) is performed simultaneously with removing the portion of the spacer layer that covers the bottom of the gaps (6). Step d can be performed for instance by plasma etching. An F-based plasma would for instance be suitable if the material of the spacer layer is silicon oxide.

In embodiments, step b of providing the material lines (4*l*) of the material layer (4) may itself proceed by providing a precursor material layer overlaying the hard mask layer (3), the precursor material layer having a shape including a set of parallel precursor material lines delimiting gaps therebetween, the gaps forming a set of precursor gaps, providing an auxiliary spacer layer following the shape of the precursor material layer, and removing the top portion of the auxiliary spacer layer. What then remains of the auxiliary spacer layer can be used as the material lines (4*l*) of the material layer (4) according to step b. Such an embodiment is an example of how the line density can be doubled for instance from a self-aligned double patterning (SADP) scheme to a self-aligned quadruple patterning (SAQP) scheme. Of course, the precursor material lines themselves could be produced by such a line doubling process. Although there is in principle no limit in the number of line doubling process that can be used, each doubling process becomes more technically challenging so that a practical limit exists.

Figure 13:
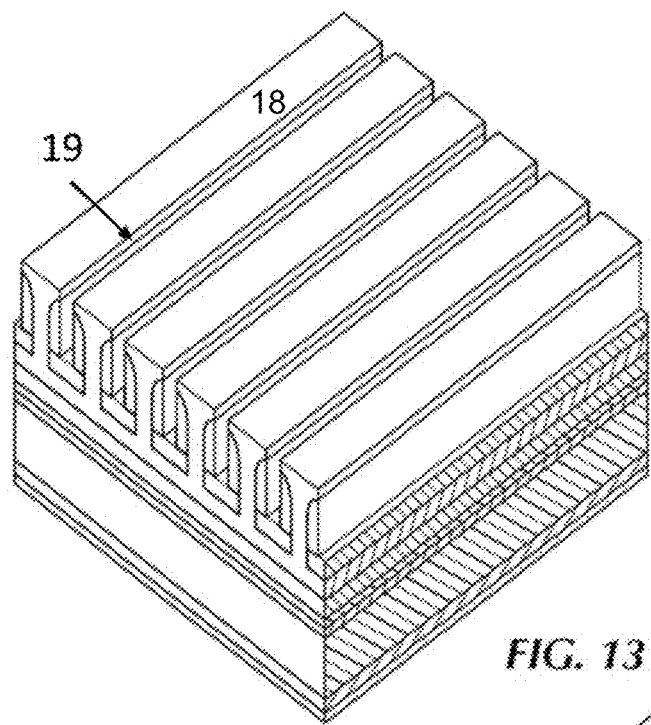

Following step d, the present disclosure includes a step e of providing a blocking element (7*b*) in a portion of a gap (6) of the first set present between two spacer lines (5*l*). This step is performed while the material lines (4*l*) are still filling the gaps (19) of the second set (the gaps 19 of the second set are visible in FIG. 13). The portion of a gap (6) of the first set is also present between two material lines (4*l*) separated therefrom by the two spacer lines (5*l*). This is depicted for an embodiment in FIG. 8. The gaps (6) have length running parallel to the longitudinal direction of the material lines (4*l*), a height, and a width. The portion of the gap which is blocked encompass the whole width of the gap, only a portion of the length, and typically the whole height.

Figure 24:
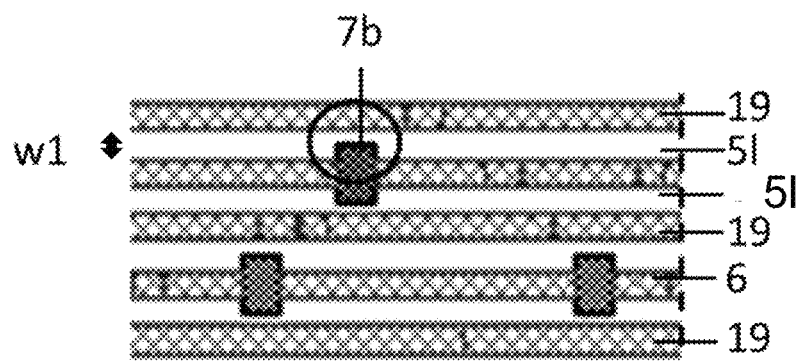
FIG. 24 is a schematic representation of a top view of a structure including a first set of spacer lines alternating with a second set of spacer lines, each pair of lines belonging to a different set being separated by a gap, some of these gaps being blocked according to the prior art.

In embodiments of the first aspect of the present disclosure, the blocking element (7*b*) may overlap with the two spacer lines (5*l*) between which the portion of the gap (6) of the first set is present. Preferably, the two spacer lines (5*l*) may have a width (w1) and the blocking element (7*b*) overlaps with each of the two spacer lines (5*l*) across their entire width (w1). This width (w1) is measured at the base of the spacer lines (5*l*) and is defined in FIG. 25. In the prior art, as depicted in FIG. 24, a blocking element (7*b*) will not overlap with each of the two spacer lines (5*l*) across their entire width (w1) because. In the case of the prior art, if the blocking element (7*b*) would be designed to overlap with the entire width (w1) of any of its neighboring spacer lines (5*l*), the blocking element would come dangerously close to a neighboring gap (19). Since the precision with which the position and the size of the blocking elements (7*b*) can be controlled is limited, the risk of the blocking element (7*b*) also at least partially blocking a neighboring gap (19) is simply too large to be tolerable. This means that in the prior art, the extent of the blocking element in the direction perpendicular to the longitudinal direction of the gaps must be strongly limited. This limitation comes with its own drawback because it increases the risk that a gap that was supposed to be blocked might actually not be blocked or not entirely blocked. This means that the risk of shorts is large.

Figure 25:
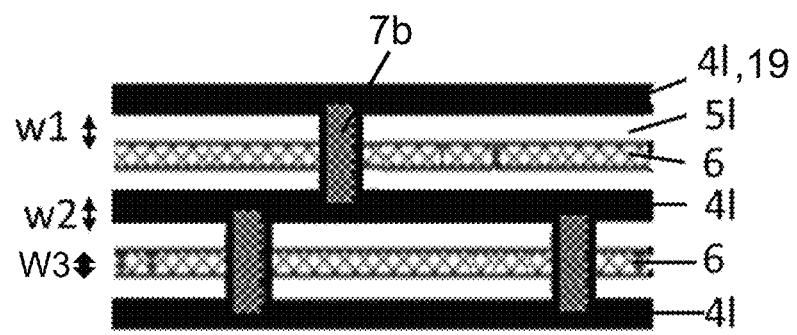
FIG. 25 is a schematic representation of a top view of a structure including a first set of spacer lines alternating with a second set of spacer lines, wherein pair of lines belonging to a different set are alternatively separated by a gap or by a material line filling a gap, some of these gaps being blocked according to an embodiment of the present disclosure.

In embodiments of the present disclosure, as depicted in FIG. 25, since the neighboring gaps (19) are filled with the material lines (4*l*), the blocking element (7*b*) may overlap with each of its two neighboring spacer lines (5*l*) across their entire width (w1) without risking to block the neighboring gaps (19). In embodiments, the blocking element (7*b*) may, in addition to overlapping with each of the two neighboring spacer lines (5*l*), further overlap with a portion of each of the two top surfaces (4*t*) of the two material lines (4*l*) between which the portion of the gap (6) is present. This is the situation represented in FIG. 25. In preferred embodiments, the position of the blocking element (7*b*) and the extent of the blocking element (7*b*) in the direction perpendicular to the longitudinal direction of the gaps (i.e. the length of the blocking element) are set in such a way as to aim at having the blocking element (7*b*) overlapping across half of the width (w2) of the two neighboring material lines (4*l*). This way, the risk of not blocking the target portion of the gap (6) of the first set and the risk of blocking partially or totally a neighboring gap (19) of the second set is reduced to a minimum.

Figure 4:
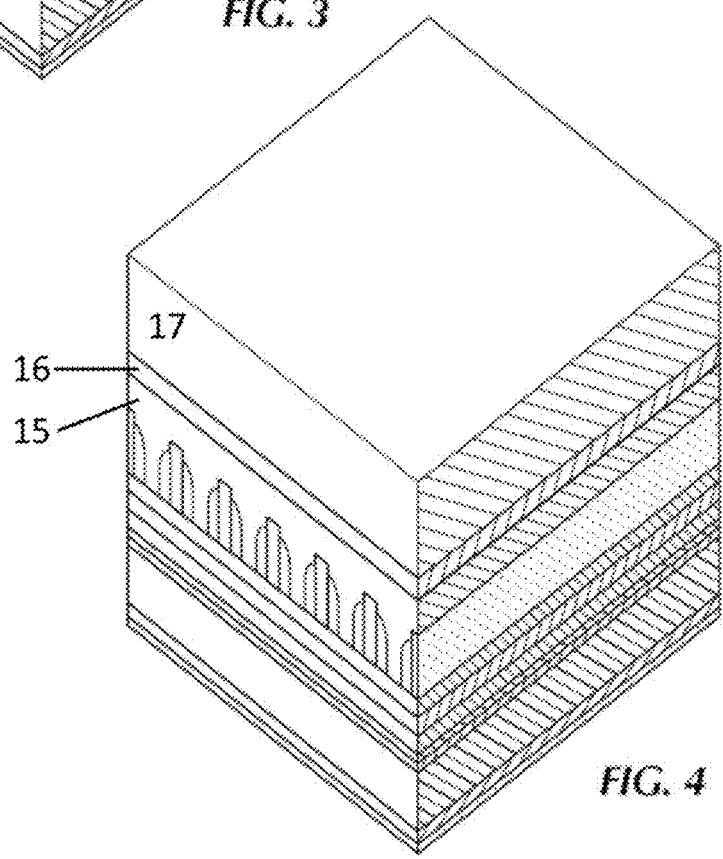

In embodiments, step e may include the following sub-steps:

A sub-step e1 including coating entirely the material lines (4*l*) and the spacer lines (5*l*) with a blocking material layer (15) in such a way as to entirely fill the gaps (6) of the first set, and as to form a flat top surface, composed of the blocking material, above the level of top surface of the material lines (4*t*). This is depicted in FIG. 4. In embodiments, the blocking material layer (15) may be spin on carbon. It may be coated by spin coating. For instance, the thickness of the blocking material layer (15) may be from 75 to 125 nm above the bottom of the gaps (6). For instance, the thickness of the blocking material layer (15) may be set at 100 nm above the bottom of the gaps (6).

A sub-step e2, performed after sub-step e1, including overlaying the flat top surface of the blocking material layer (15) with a spin-on-glass layer (16). This is depicted in FIG. 4. The spin-on glass layer (16) may be deposited for instance by spin-coating.

A sub-step e3, performed after sub-step e2, including overlaying the spin-on-glass layer (16) with a resist layer (17). This is also depicted in FIG. 4.

A sub-step e4, performed after sub-step e3, including exposing the resist layer (17) through a photolithographic mask, thereby making insoluble portions of the resist layer (17) corresponding to the blocking element (7b) to be formed from the blocking material layer (15).

Figure 5:
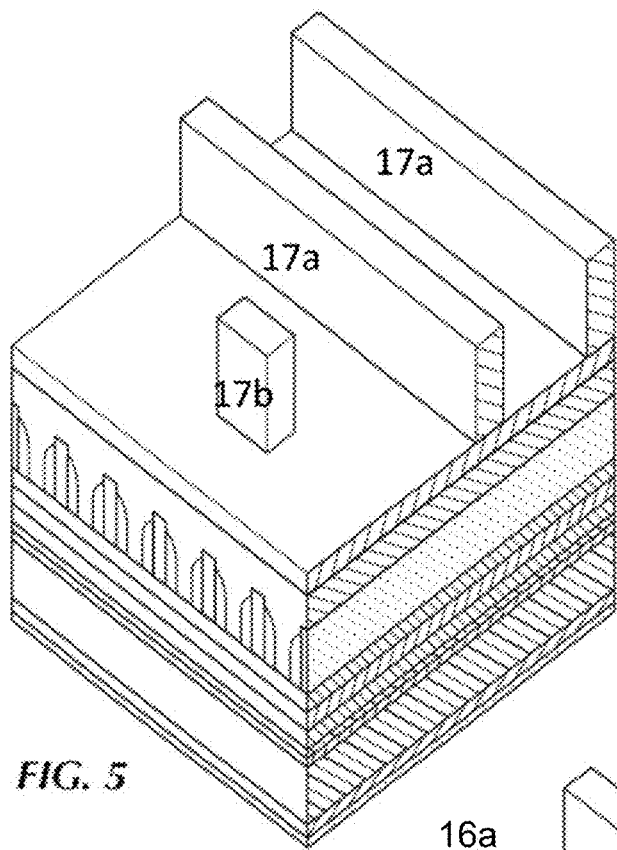

A sub-step e5, performed after sub-step e4, including developing the resist layer (17), thereby forming a resist element (17b) corresponding to the blocking element (7b) to be formed from the blocking material layer (15). This is depicted for an embodiment in FIG. 5. In the embodiment of FIG. 5, in addition to the resist element (17b), two other longer resist elements (17a) have been formed. Such longer resist elements may also be formed according to embodiments of the first aspect of the present disclosure. For instance, this could be useful if a same corresponding portion along the length of more than one consecutive lines should be blocked.

Figure 6:
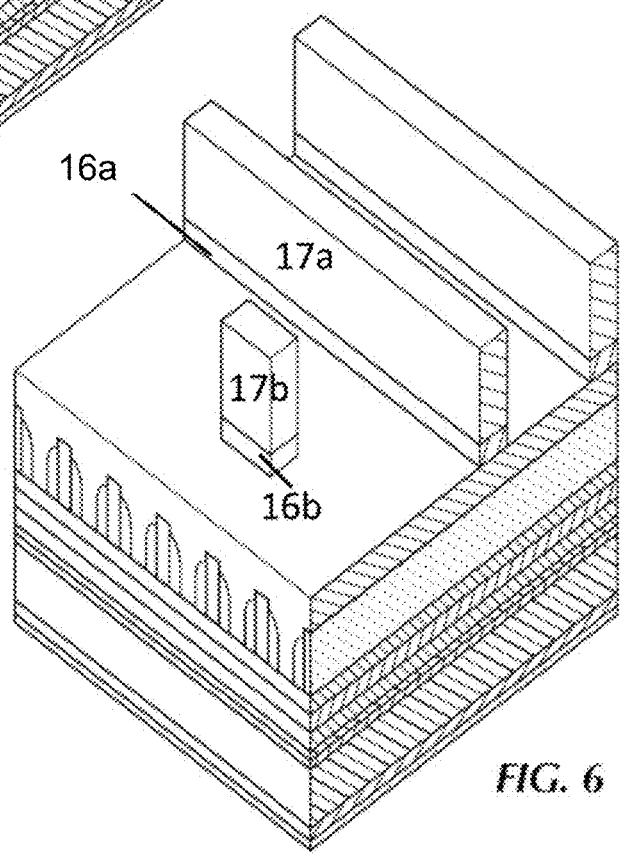

A sub-step e6, performed after sub-step e5, including opening the spin-on-glass layer (16) by etching by using the resist element(s) (17a, 17b) as a mask. The resulting structure for an embodiment is depicted in FIG. 6. In this figure, it is depicted that spin-on-glass elements (16a, 16b) having a same horizontal cross-section than the resist elements (17a, 17b), are present directly below the resist elements (17a, 17b).

Figure 7:
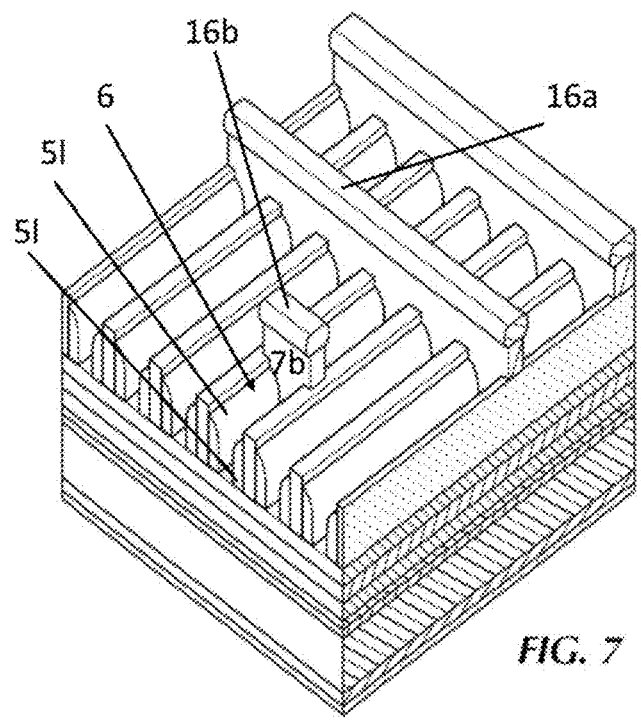

A sub-step e7, performed after sub-step e6, including opening the blocking material layer (15) by selectively etching the blocking material layer (15) (e.g. a spin-on carbon layer) by using the spin on glass elements (16a, 16b) as a mask, thereby forming the blocking elements (7a, 7b). The resulting structure is depicted in FIG. 7.

A sub-step e8, performed after sub-step e7, including removing the spin-on glass elements (16a, 16b). The resulting structure is depicted in FIG. 8. This sub-step is optional.

Figure 9:
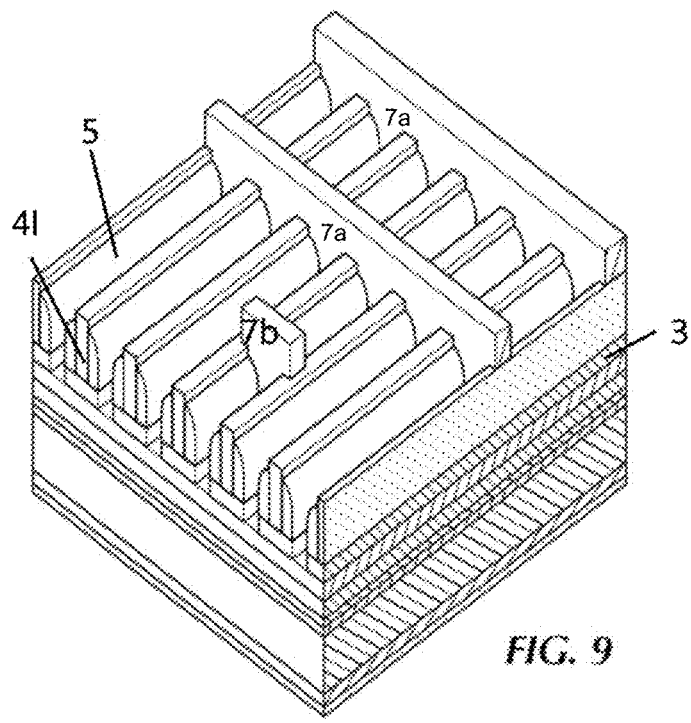

In FIGS. 8 and 9, the blocking element is not capped with a spin-on glass element by the time the next step, step f, is performed. This is however just one option. Another option is to leave in place the spin-on glass capping element before performing step f. In this embodiment, step e8 is performed after step f.

Following step e, the present disclosure includes a step f of etching selectively the hard mask layer (3) by using the material layer (4), the spacer lines (5l) and the blocking element (7b) as a mask, thereby providing a first set of parallel trenches (8) in the hardmask layer (3), wherein a trench (8a) has a blocked portion (3b). The resulting structure is depicted in FIG. 9. Of course, in embodiments of the first aspect of the present disclosure, more than one blocking element may be provided to block one or more trenches (8a).

Figure 10:
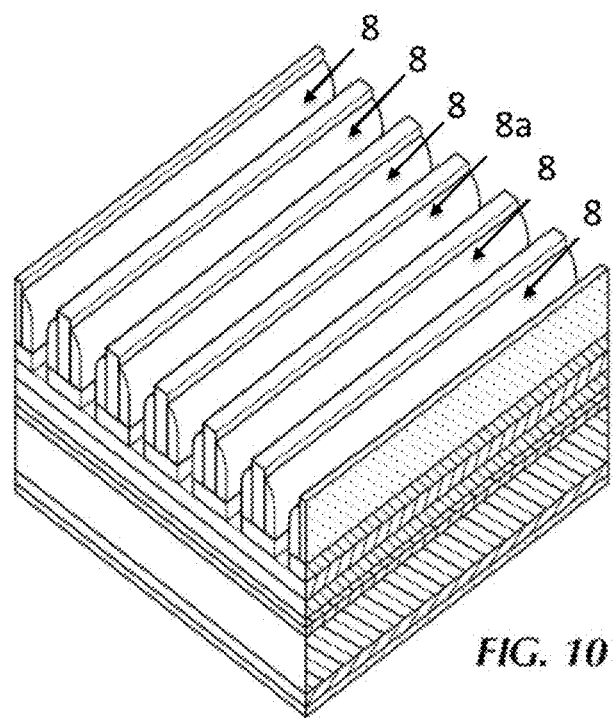
Figure 11:
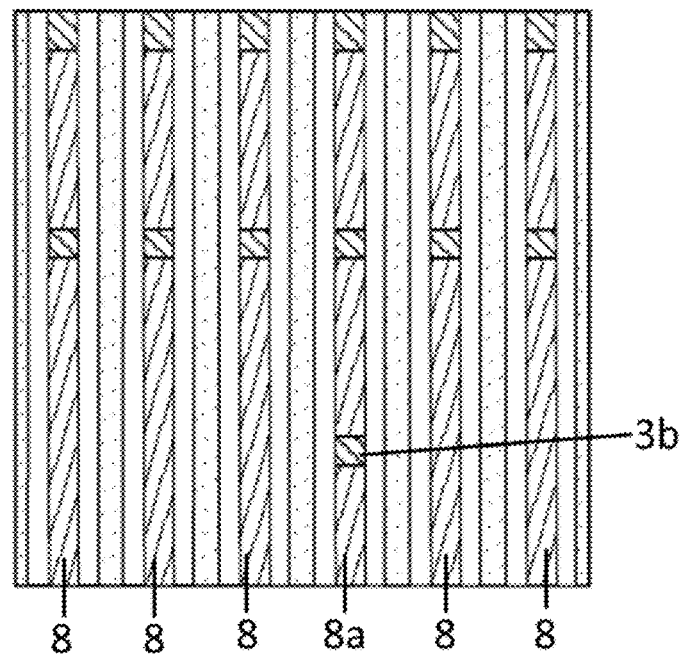
FIG. 11 is a top view of the structure shown in FIG. 10.

Typically, following step f, the present disclosure may include a step g of selectively removing the blocking element (7b). The resulting structure is shown if FIGS. 10 and 11. FIG. 11 is a view of the resulting structure seen from above in order to see the blocked portions (3b) not visible in the perspective view of FIG. 10.

Figure 26:
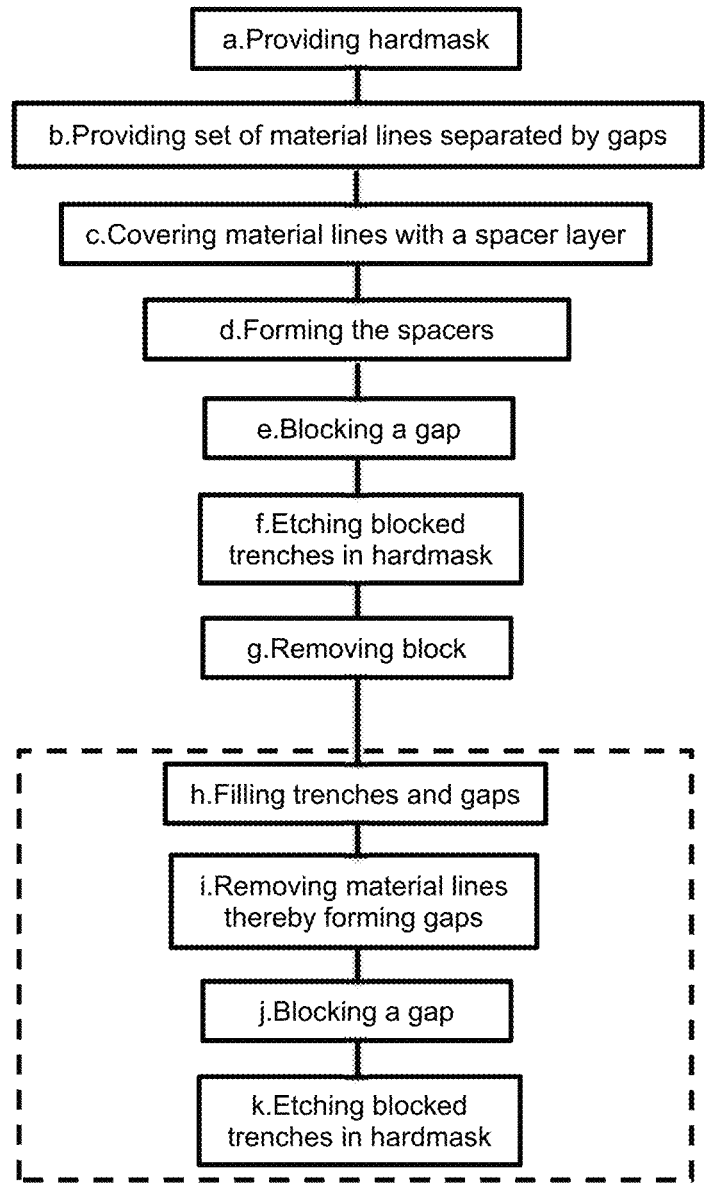
FIG. 26 is a flowchart showing steps of a method according to embodiments of the first aspect of the present disclosure.

The following steps h to k present in embodiments of the present disclosure are summarized in the portion of FIG. 26 delimited by the dashed line.

Figure 12:
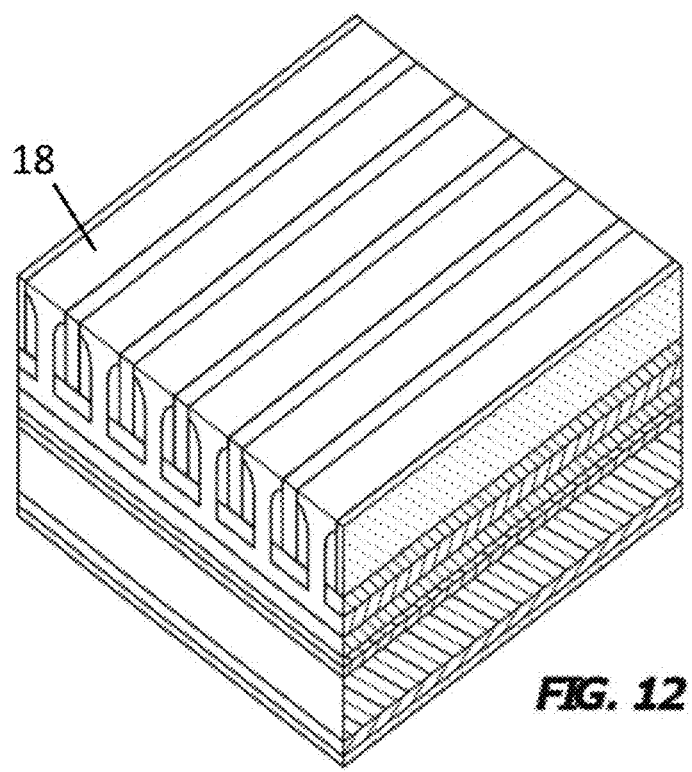

In embodiments, the method may further include the following steps:

After step g, a step h of filling the first set of parallel trenches (8) and the gaps (6) of the first set with a filling material (18) is performed in such a way that a top surface of the filling material (18) is coplanar with the top surface (4t) of the material lines (4l). The resulting structure is depicted for an embodiment in FIG. 12. This can for instance be performed by overfilling the first set of parallel trenches (8) and the gaps (6) of the first set with a filling material (18) in order to completely cover the structure with the filling material, then removing a top portion of the filling material by chemical mechanical planarization.

After step h, a step i of selectively removing the material lines (4l) is performed, thereby forming a second set of gaps (19). For instance, if the material lines (4l) are made of amorphous silicon, the hard mask (3) is made of TiN and the filling material is $SiO_2$, removing the material lines (4l) must be performed with an etching chemistry which etches selectively amorphous silicon and preserves TiN and $SiO_2$. Such etching chemistries are well known to the person skilled in the art. For instance, a Br-based plasma is suitable.

Figure 17:
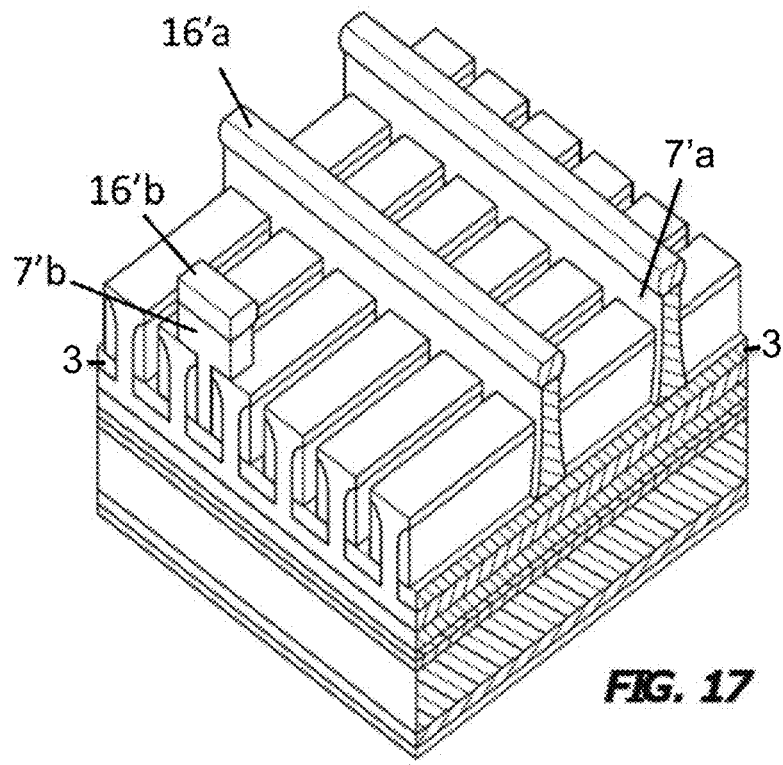

After step i, a step j is performed including providing a further blocking element (7'b) in a portion of a gap (19) of the second set, present between two spacer lines (5l). The resulting structure is depicted in FIG. 17.

In embodiments of the first aspect of the present disclosure, the further blocking element (7'b) may overlap with the two spacer lines (5l) between which the portion of the gap (19) of the second set is present. Preferably, the two spacer lines (5l) may have a width (w1) and the further blocking element (7'b) overlap with each of the two spacer lines (5l) across their entire width (w1). The advantages are analogous to the advantages described for the extent of the blocking element (7b) blocking a gap (6) of the first set.

In embodiments, the further blocking element (7'b) may, in addition to overlapping with each of the two neighboring spacer lines (5l), further overlap with a portion of the filled gaps (6) of the first set neighboring the portion of the gap (19) of the second set. This is the situation represented in FIG. 17. In preferred embodiments, the position of the blocking element (7'b) and the extent of the blocking element (7'b) in the direction perpendicular to the longitudinal direction of the gaps (i.e. the length of the blocking element) are set in such a way as to aim at having the blocking element (7'b) overlapping across half of the width (w3) of the two neighboring filled gap (6). This way, the risk of not blocking the target portion of the gap (19) and the risk of blocking partially or totally a neighboring gap (6) of the first set is reduced to a minimum.

Figure 14:
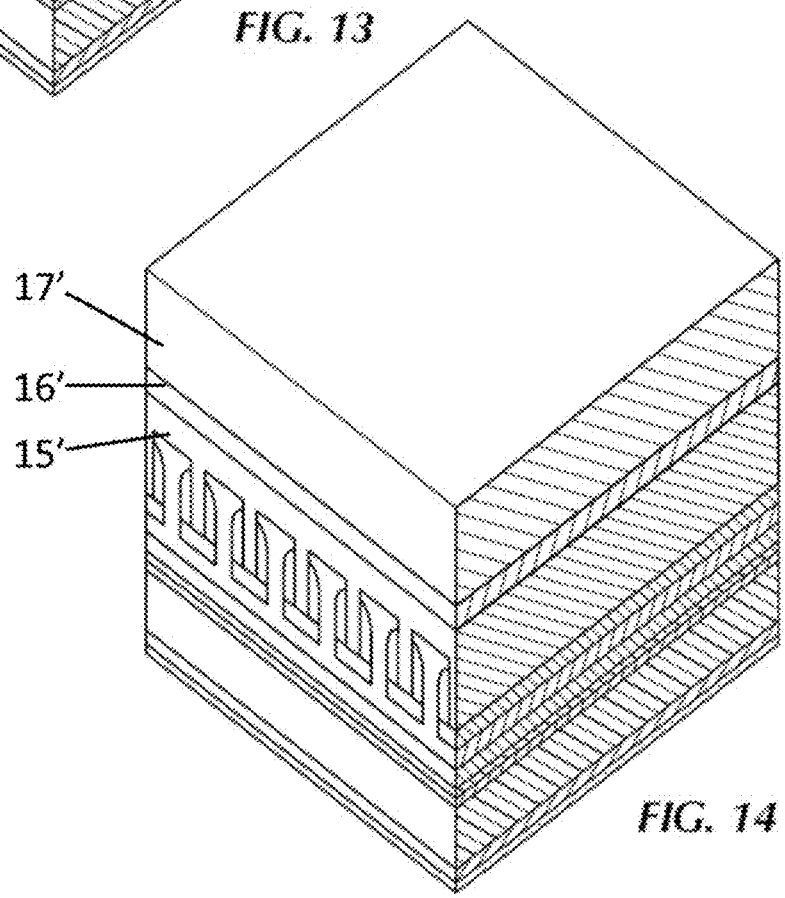

In embodiments, step j may be decomposed in the following sub-steps:

A sub-step j1 including coating entirely the spacer lines (5l) and the filling material (18) with a blocking material layer (15') in such a way as to entirely fill the gaps (19), and as to form a flat top surface, composed of the blocking material (15'), above the level of top surface of the filling material (18). This is depicted in FIG. 14. In embodiments, the blocking material layer (15') may be spin on carbon and may be coated by spin coating. For instance, the thickness of the blocking material layer (15') may be from 75 to 125 nm above the bottom of the gaps (19). For instance, the thickness of the blocking material layer (15') may be set at 100 nm above the bottom of the gaps (19).

A sub-step j2, performed after sub-step j1, including overlaying the flat top surface of the blocking material layer (15') with a spin-on-glass layer (16'). This is also depicted in FIG. 14. The spin-on glass layer (16') may be deposited for instance by spin-coating.

A sub-step j3, performed after sub-step j2, including overlaying the spin-on-glass layer (16') with a resist layer (17'). This is also depicted in FIG. 14.

A sub-step j4, performed after sub-step j3, including exposing the resist layer (17') through a photolithographic mask, thereby making insoluble portions of the resist layer (17') corresponding to the blocking element (7'b) to be formed from the blocking material layer (15').

Figure 15:
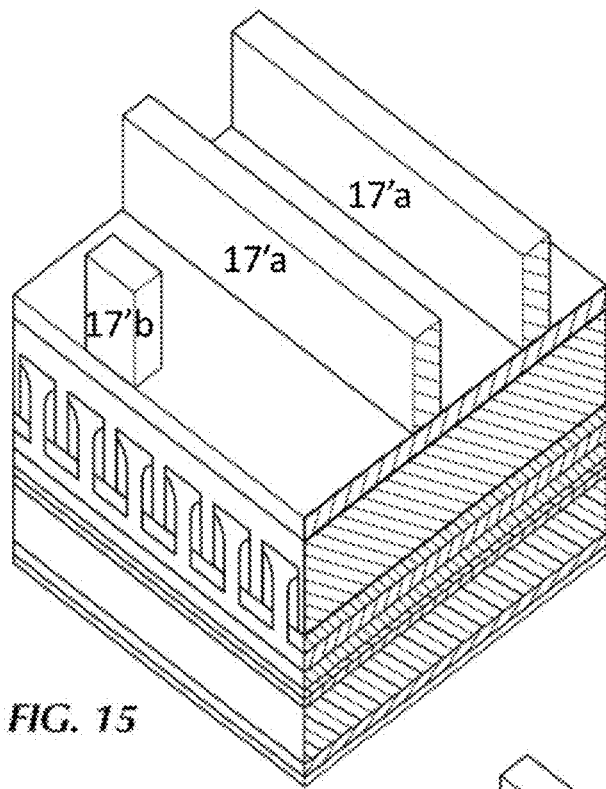

A sub-step j5, performed after sub-step j4, including developing the resist layer (17'), thereby forming a resist element (17'b) corresponding to the blocking element (7'b) to be formed from the blocking material layer (15'). This is depicted for an embodiment in FIG. 15. In the embodiment of FIG. 15, in addition to the resist element (17b), two other longer resist elements (17'a) have been formed. The potential use of such longer resist elements is analog to the use discussed for elements (17a) of FIG. 5.

Figure 16:
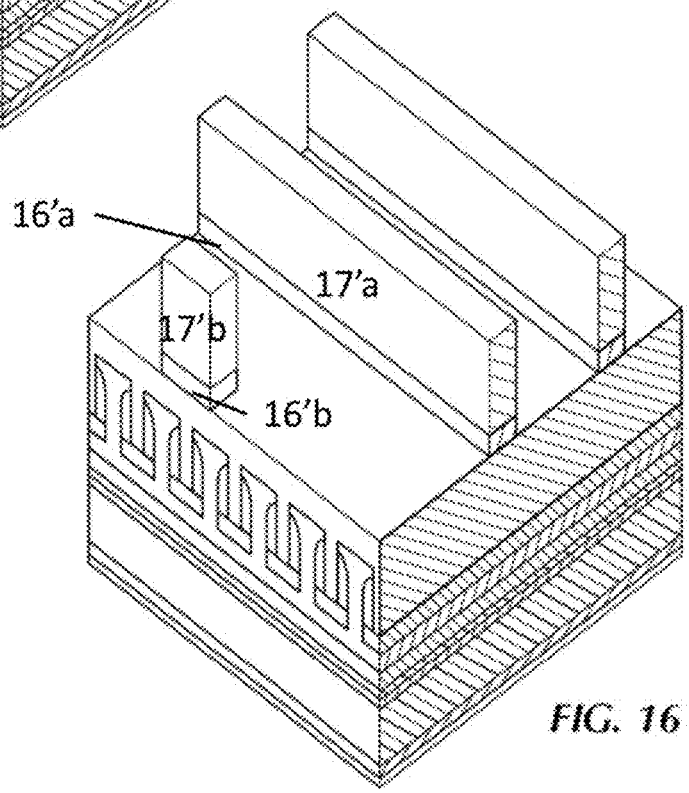

A sub-step j6, performed after sub-step j5, including opening the spin-on-glass layer (16') by etching by using the resist element(s) (17'a, 17'b) as a mask. The resulting structure for an embodiment is depicted in FIG. 16. In this figure, it is depicted that spin-on-glass elements (16'a, 16'b) having a same horizontal cross-section than the resist elements (17'a, 17'b), are present directly below the resist elements (17'a, 17'b).

A sub-step j7, performed after sub-step j6, including selectively etching the blocking material layer (15') by using the spin on glass elements (16'a, 16'b) as a mask, thereby forming the blocking elements (7'a, 7'b). The resulting structure is depicted in FIG. 17.

In embodiments, step k may be performed before or after a step of removing the spin on glass element(s) (16'a, 16'b).

After step j, a step k may be performed including etching selectively through the hard mask layer (3) by using the filling material (18) and the blocking element (7'b) as a mask, thereby providing a second set of parallel trenches (8') in the hardmask layer (3), wherein a trench (8'a) within the second set has a blocked portion (3'b). This is depicted for an embodiment in FIG. 18.

Figure 18:
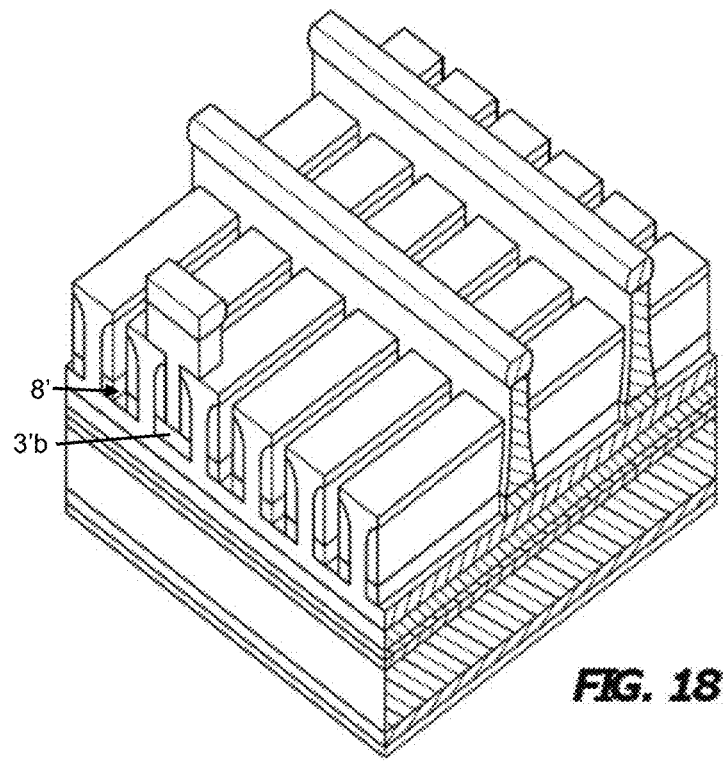

As depicted in FIGS. 17 and 18, the blocking element (7'b) is still capped with a spin-on-glass element by the time the next step, step k, is performed. This is however just one option. Another option is to remove the spin-on-glass element before performing step k.

Figure 19:
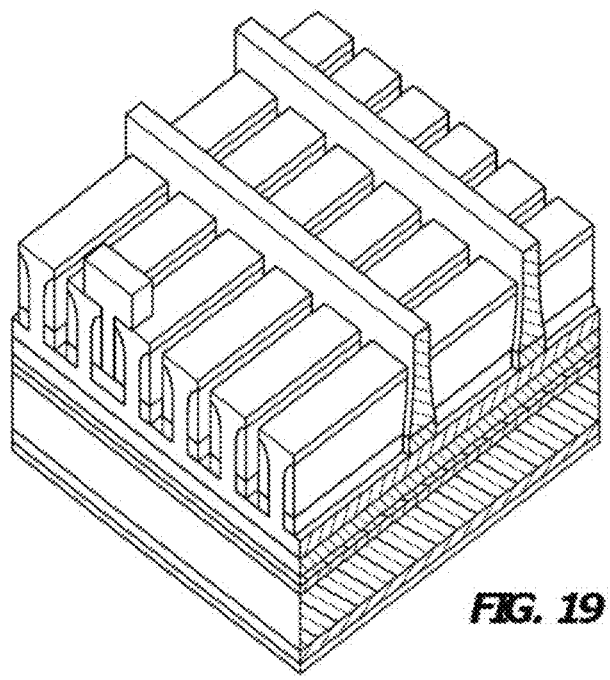
Figure 20:
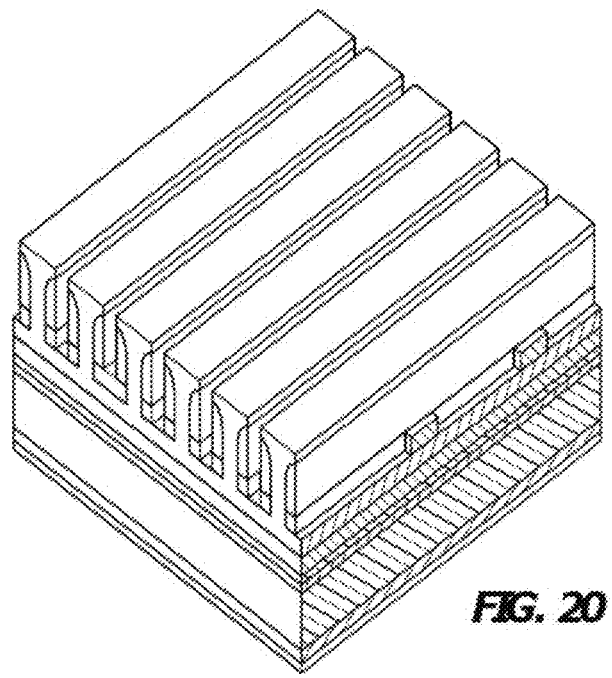

After step k, the following steps may additionally be performed:

A step l of selectively removing the blocking element (7'b). The resulting structure is shown in FIG. 20 for an embodiment of the present disclosure. This removal can be for instance performed in two steps by first removing the spin-on-glass element (16'a, 16'b) as depicted in FIG. 19 followed by removing the blocking elements (7'a, 7'b) as depicted in FIG. 20.

Figure 21:
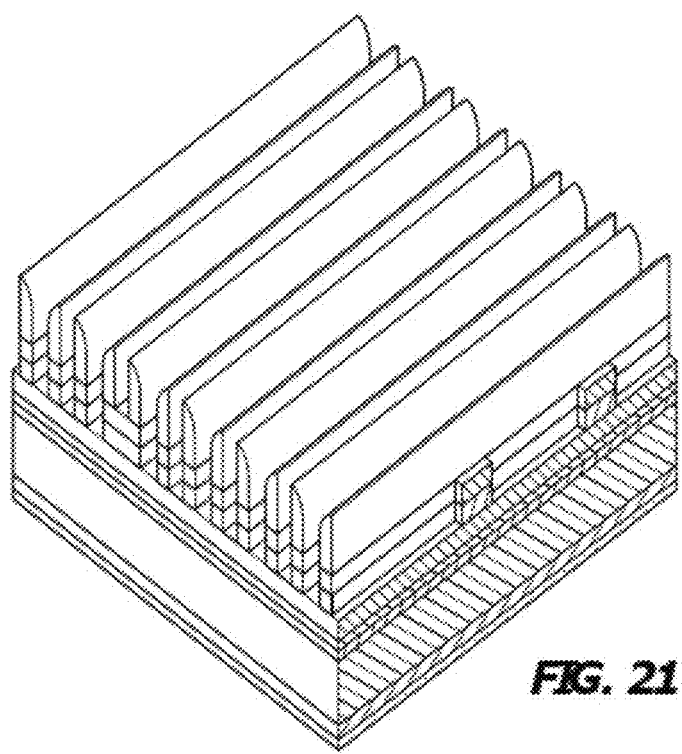

In embodiments, the hardmask layer (3) may be on top of a target substrate (9, 12) and the method may further include a step of selectively etching the target substrate (9, 12) through the hard mask layer (3), thereby forming trenches (1) in the target substrate (9, 12), wherein at least one trench (1a) amongst the trenches (1) has a blocked portion (2). The resulting structure is shown in FIG. 21 for an embodiment of the present disclosure.

In embodiments, the method may further include a step m after step l of selectively removing the spacer lines (5l). The resulting structure is shown in FIG. 22. In this figure, trenches (8) of the first set are depicted alternating with trenches (8') of the second set. Several blocked portions (3b, 3'b) are depicted for each of these trenches. None of the blocked portion fails to block the portion of the trench it is intended to block. None of the blocked portions in one set of trenches (8 or 8') block a trench belonging to the other set of trenches (8' or 8).

At this stage, the resulting structure is typically cleaned with a liquid cleaning solution.

The target substrate (9, 12) does not need to be in contact with the hard mask layer (3) although it can be. Intermediate layers may be present between the hard mask layer and the target substrate. For instance, an interface layer (13) and a silicon oxide cap layer (14) on the interface layer (13) can be present.

In an exemplary embodiment, based on the specific layer stack of FIG. 1, the target substrate (9) may be a first target substrate (9) on top of a further hardmask layer (3'), and the method may include a further step of etching the further hardmask layer (3') by using the first target layer (9) as a mask. The resulting structure can be seen in FIG. 23. The further hardmask layer (3') may then be used to pattern a further (ultimate) target substrate (12) such as the underlying ultra low-k layer (12). Such a use of two hard mask layers (3, 3') permits to remove silicon oxide present in excess.

In embodiments, the target substrate (9, 12) is preferably a dielectric layer, preferably a low-k material layer, and more preferably an ultra low-k material layer.

In embodiments of the first aspect of the present disclosure, the method may further include a step of filling the trenches (1) in the target substrate with an electrically conductive material. This step is not depicted.

In a second aspect, the present disclosure relates to an intermediate structure in the fabrication of an integrated circuit, the structure including a hardmask layer (3), a set of n parallel material lines (4l), a set of 2n spacer lines (5l) separated alternatively by material lines (4l) and by gaps (6), and a blocking element (7b) in a portion of a gap (6) present between two spacer lines (5l). This structure is represented for an embodiment in FIG. 8.

The hardmask layer (3), the material lines (4l), the spacer lines (5l), the gaps (6), and the blocking element (7b) may be according to any embodiment of the first aspect.

It is to be understood that although preferred embodiments, specific constructions and configurations, as well as materials, have been discussed herein for devices according to the present disclosure, various changes or modifications in form and detail may be made without departing from the scope and spirit of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

What is claimed is:

1. A method of forming a pattern for an integrated circuit, comprising:
   (a) providing a hardmask layer;
   (b) overlaying the hard mask layer with a material layer having a shape comprising a set of parallel material lines delimiting gaps therebetween, the gaps forming a first set of gaps;
   (c) providing a spacer layer following the shape of the material layer, the spacer layer thereby covering the top of the material lines;
   (d) removing a top portion of the spacer layer in such a way as to expose a top surface of the material lines, thereby forming spacer lines alternatively separated by material lines and by gaps of the first set;

(e) providing a blocking element in a portion of a gap of the first set present between two spacer lines and between two material lines;

(f) etching selectively the hard mask layer by using the material layer, the spacer lines and the blocking element as a mask, thereby providing a first set of parallel trenches in the hardmask layer, wherein a trench has a blocked portion; and (g) selectively removing the blocking element.

2. The method according to claim 1, wherein the blocking element overlaps with the two spacer lines between which the portion of the gap is present.

3. The method according to claim 2, wherein the two spacer lines have a width (w1) and wherein the blocking element overlaps with each of the two spacer lines across their entire width (w1).

4. The method according to claim 3, wherein the blocking element further overlaps with a portion of each of the two top surfaces of the two material lines between which the portion of the gap is present.

5. The method according to claim 1, further comprising:

(h) filling the first set of parallel trenches and the gaps of the first set with a filling material in such a way that a top surface of the filling material is coplanar with the top surface of the material lines;

(i) selectively removing the material lines, thereby forming a second set of gaps;

(j) providing a further blocking element in a portion of a gap of the second set, present between two spacer lines; and (k) etching selectively through the hard mask layer by using the filling material and the blocking element as a mask, thereby providing a second set of parallel trenches in the hardmask layer, wherein a trench within the second set has a blocked portion.

6. The method according to claim 5, wherein the further blocking element overlaps with the two spacer lines between which the portion of the gap of the second set is present.

7. The method according to claim 6, wherein the two spacer lines have a width (w1) and wherein the further blocking element overlaps with each of the two spacer lines across their entire width (w1).

8. The method according to claim 7, wherein the further blocking element further overlaps with a portion of the filled gaps of the first set neighboring the portion of the gap of the second set.

9. The method according to claim 1, wherein the hardmask layer is on top of a target substrate and wherein the method further comprises a step of etching the target substrate through the hard mask layer, thereby forming trenches in the target substrate, wherein at least one trench amongst the trenches has a blocked portion.

10. The method according to claim 9, further comprising filling the trenches in the target substrate with an electrically conductive material.

* * * * *